(12) United States Patent
Cornelissen et al.

(10) Patent No.: US 11,933,462 B2
(45) Date of Patent: Mar. 19, 2024

(54) LASER PHOSPHOR BASED PIXELATED LIGHT SOURCE

(71) Applicant: SIGNIFY HOLDING B.V., Eindhoven (NL)

(72) Inventors: Hugo Johan Cornelissen, Escharen (NL); Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/011,866

(22) PCT Filed: Jul. 5, 2021

(86) PCT No.: PCT/EP2021/068452
§ 371 (c)(1),
(2) Date: Dec. 21, 2022

(87) PCT Pub. No.: WO2022/008409
PCT Pub. Date: Jan. 13, 2022

(65) Prior Publication Data
US 2023/0313954 A1 Oct. 5, 2023

(30) Foreign Application Priority Data
Jul. 7, 2020 (EP) .................................... 20184462

(51) Int. Cl.
*F21K 9/64* (2016.01)
*F21V 7/08* (2006.01)
(Continued)

(52) U.S. Cl.
CPC .................. *F21K 9/64* (2016.08); *F21V 7/08* (2013.01); *F21V 7/06* (2013.01); *F21Y 2113/00* (2013.01); *G03B 21/204* (2013.01)

(58) Field of Classification Search
CPC ....... F21K 9/64; G03B 21/204; H01S 5/0071; H01S 5/0087; H01S 5/02326; H01S 5/02469
See application file for complete search history.

(56) References Cited

U.S. PATENT DOCUMENTS 10,551,728 B1 2/2020 Novotny et al.
2013/0265561 A1 10/2013 Takahira et al.
(Continued)

FOREIGN PATENT DOCUMENTS

WO 2019061371 A1 4/2019
WO 2020116084 A1 6/2020

*Primary Examiner* — Zheng Song

(57) ABSTRACT

The invention provides a light generating device (1000) comprising (i) n laser light sources (10), (ii) focusing optics (20), and (iii) a luminescent body (200), wherein: (A) the n laser light sources (10) are configured to generate laser light source light (11); wherein the focusing optics (20) are configured to focus the laser light source light (11) into a focused beam (21) of laser light source light (11); wherein $n \geq 2$; (B) the luminescent body (200) comprises a luminescent material (210), wherein the luminescent body (200) is configured in a light receiving relationship with the n laser light sources (10), wherein the luminescent material (210) is configured to convert at least part of the laser light source light (11) into luminescent material light (211); (C) the n laser light sources (10) and focusing optics (20) are configured to provide in an operational mode light spots (300) of laser light source light (11) on the luminescent body (200); wherein k sets of light spots (300) each have an individually selected number of m light spots (300), wherein two or more of the light spots (300) within each set have a partial overlap, wherein $2 \leq m \leq n$ and $1 \leq k < n$; and (D) wherein a first spot area (310) is defined by 10-100% of the maximum intensity in the light spot (300), wherein for at least one of the light spots (300) within at least one of the k sets applies that in the range
(Continued)

of 5-80% of its first spot area (310) overlaps with at least another first spot area (310) within the set.

15 Claims, 8 Drawing Sheets

(51) Int. Cl.
*F21V 7/06* (2006.01)
*F21Y 113/00* (2016.01)
*G03B 21/20* (2006.01)

(56) References Cited

U.S. PATENT DOCUMENTS

| | | |
|---|---|---|
| 2016/0153624 A1* | 6/2016 | Yajima ............... F21K 9/64 216/94 |
| 2017/0356613 A1 | 12/2017 | Van Bommel et al. |
| 2018/0128451 A1 | 5/2018 | Adema et al. |
| 2018/0156409 A1 | 6/2018 | Schwaiger |
| 2018/0316160 A1 | 11/2018 | Raring et al. |
| 2022/0290840 A1 | 9/2022 | Cornelissen et al. |
| 2022/0290841 A1* | 9/2022 | Hikmet ............... F21V 7/26 |
| 2022/0341550 A1* | 10/2022 | Hikmet ............... H01S 5/0087 |

\* cited by examiner

LASER PHOSPHOR BASED PIXELATED LIGHT SOURCE

CROSS-REFERENCE TO PRIOR APPLICATIONS

This application is the U.S. National Phase application under 35 U.S.C. § 371 of International Application No. PCT/EP2021/068452, filed on Jul. 5, 2021, which claims the benefit of European Patent Application No. 20184462.8, filed on Jul. 7, 2020. These applications are hereby incorporated by reference herein.

FIELD OF THE INVENTION

The invention relates to a light generating device and to a luminaire or a lamp or a projection device comprising such light generating device.

BACKGROUND OF THE INVENTION

White light sources using a laser diode and phosphor are known in the art. US2018/0316160, for instance, describes a device and method for an integrated white colored electromagnetic radiation source using a combination of laser diode excitation sources based on gallium and nitrogen containing materials and light emitting source based on phosphor materials. A violet, blue, or other wavelength laser diode source based on gallium and nitrogen materials may be closely integrated with phosphor materials, such as yellow phosphors, to form a compact, high-brightness, and highly-efficient, white light source. The phosphor material is provided with a plurality of scattering centers scribed on an excitation surface or inside bulk of a plate to scatter electromagnetic radiation of a laser beam from the excitation source incident on the excitation surface to enhance generation and quality of an emitted light from the phosphor material for outputting a white light emission either in reflection mode or transmission mode.

US2018/156409A discloses an illumination device includes multiple semiconductor primary light sources for emitting respective primary light beams, at least one movable mirror, which can be illuminated by means of the primary light beams, and which can assume at least two angle positions, and a luminophore element, which can be illuminated by means of primary light beams deflected by the at least one mirror. Light spots of the individual primary light beams are locally differentiable on the at least one luminophore element, an overall light spot composed of the light spots of the individual primary light beams is locally differentiable on the at least one luminophore element depending on the angle position of the at least one movable mirror, and at least one beam property of at least one primary light beam incident on the at least one luminophore element is variable during operation of the illumination device.

SUMMARY OF THE INVENTION

While white LED sources can give an intensity of e.g. up to about 300 lm/mm$^2$; static phosphor converted laser white sources can give an intensity even up to about 20.000 lm/mm$^2$. Ce doped garnets (e.g. YAG, LuAG) may be the most suitable luminescent convertors which can be used for pumping with blue laser light as the garnet matrix has a very high chemical stability. Further, at low Ce concentrations (e.g. below 0.5%) temperature quenching may only occur above about 200° C. Furthermore, emission from Ce has a very fast decay time so that optical saturation can essentially be avoided. Assuming e.g. a reflective mode operation, blue laser light may be incident on a phosphor. This may in embodiments realize almost full conversion of blue light, leading to emission of converted light. It is for this reason that the use of garnet phosphors with relatively high stability and thermal conductivity is suggested. However, also other phosphors may be applied. Heat management may remain an issue when extremely high-power densities are used.

High brightness light sources can be used in applications such as projection, stage-lighting, spot-lighting and automotive lighting. For this purpose, laser-phosphor technology can be used wherein a laser provides laser light and e.g. a (remote) phosphor converts laser light into converted light. The phosphor may in embodiments be arranged on or inserted in a heatsink for improved thermal management and thus higher brightness.

One of the problems that may be associated with such (laser) light sources is the heat management of the ceramic phosphor. Other problems associated with such laser light sources may be the desire to create compact high power devices.

Hence, it is an aspect of the invention to provide an alternative luminescent element, which preferably further at least partly obviates one or more of above-described drawbacks. The present invention may have as object to overcome or ameliorate at least one of the disadvantages of the prior art, or to provide a useful alternative.

In a first aspect, the invention provides a light generating device ("lighting device" or "device") comprising (i) n light sources, especially n laser light sources (ii) focusing optics, such as in embodiments reflective focusing optics, and (iii) a plurality of luminescent bodies. Especially, the n light sources, especially laser light sources are configured to generate light source light, especially laser light source light. Further, the focusing optics may be configured to focus the light source light, especially laser light source light into a focused beam of light source light, especially laser light source light. More especially, the focusing optics may be configured to reflect and focus the light source light, especially laser light source light into a focused beam of light source light, especially laser light source light. Further, in embodiments n≥2. Especially, the luminescent body comprises a luminescent material. Yet further, especially the luminescent body is configured in a light receiving relationship with the n light sources, especially laser light sources. The luminescent material is configured to convert at least part of the light source light, especially laser light source light into luminescent material light. Especially, the n light sources, especially laser light sources, and (reflective) focusing optics are configured to provide in an operational mode (n) light spots of light source light, especially laser light source light on the luminescent body. In specific embodiments, k sets of light spots each have an individually selected number of m light spots. More especially, two or more of the light spots within each set may have a partial overlap. In specific embodiments, 2≤m≤n and 1≤k<n. Hence, in specific embodiments the invention provides a light generating device comprising (i) n light sources, especially laser light sources (ii) (reflective) focusing optics, and (iii) a luminescent body, wherein: (A) the n light sources, especially laser light sources are configured to generate light source light, especially laser light source light; wherein the (reflective) focusing optics are configured to (reflect and) focus the light source light, especially laser light source light into a focused beam of light source light, especially laser light source light; wherein n≥2; (B) the luminescent body comprises a luminescent material, wherein the luminescent body is configured in a light receiving relationship with the n light sources, especially laser light sources wherein the luminescent material is configured to convert at least part of the light source light, especially laser light source light into luminescent material light; and (C) the n light sources, especially laser light sources and (reflective) focusing optics are configured to provide in an operational mode light spots of light source light, especially laser light source light on the luminescent body; wherein k sets of light spots each have an individually selected number of m light spots, wherein two or more of the light spots within each set have a partial overlap, wherein $2 \leq m \leq n$ and $1 \leq k < n$. Yet further, in even more specific embodiments, the invention provides a light generating device comprising n lighting units and a luminescent body, wherein: (A) the lighting units comprise (i) a laser light source configured to generate light source light, especially laser light source light and (ii) reflective focusing optics configured to reflect and focus the light source light, especially laser light source light into a focused beam of light source light, especially laser light source light; wherein $n \geq 2$; (B) the luminescent body comprises a luminescent material, wherein the luminescent body is configured in a light receiving relationship with the n lighting units, wherein the luminescent material is configured to convert at least part of the light source light, especially laser light source light into luminescent material light; and (C) the lighting units are configured to provide in an operational mode a light spot of light source light, especially laser light source light on the luminescent body; wherein k sets of light spots each have an individually selected number of m light spots, wherein two or more of the light spots within each set have a partial overlap, wherein $2 \leq m \leq n$ and $1 \leq k < n$. In specific embodiments, a first spot area is defined by 10-100% of the maximum intensity in the light spot, wherein for at least one of the light spots within at least one of the k sets applies that in the range of 5-80% of its first spot area overlaps with at least another first spot area within the set. Hence, in embodiments the invention also provides a light generating device comprising (i) n light sources, especially laser light sources (ii) focusing optics, such as reflective focusing optics, and (iii) a luminescent body, wherein: (A) the n light sources, especially laser light sources are configured to generate light source light, especially laser light source light; wherein the focusing optics are configured to (reflect and) focus the light source light, especially laser light source light into a focused beam of light source light, especially laser light source light; wherein $n \geq 2$; (B) the luminescent body comprises a luminescent material, wherein the luminescent body is configured in a light receiving relationship with the n light sources, especially laser light sources wherein the luminescent material is configured to convert at least part of the light source light, especially laser light source light into luminescent material light; (C) the n light sources, especially laser light sources and focusing optics are configured to provide in an operational mode light spots of light source light, especially laser light source light on the luminescent body; wherein k sets of light spots each have an individually selected number of m light spots, wherein two or more of the light spots within each set have a partial overlap, wherein $2 \leq m \leq n$ and $1 \leq k < n$; and (D) wherein a first spot area is defined by 10-100% of the maximum intensity in the light spot, wherein for at least one of the light spots within at least one of the k sets applies that in the range of 5-80% of its first spot area overlaps with at least another first spot area of another light sport within the set.

With such light generating device thermal heat management may be improved and thermal load may be better handled. Further, with such light generating device it may be possible to have a pixelated light source, wherein the differences of the intensities between pixels is not too low. In this way, a pixelated light source with a relatively even light distribution over the luminescent body (face) may be provided, while also pixilation may be possible. In this way, light sources for different applications, such as high brightness applications like e.g. stage lighting, medical lighting, projection devices, automotive lighting, etc., may be provided.

As indicated above, the light generating device comprises (i) n light sources, especially laser light sources (ii) focusing optics, and (iii) a plurality of luminescent bodies.

Hence, the light generating device comprise n light sources. More especially, the light generating device comprises n laser light sources.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser.

Hence, in embodiments the light source comprises a laser light source. In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride (Sm:CaF$_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate Nd:YCa$_4$O(BO$_3$)$_3$ or Nd:YCOB, neodymium doped yttrium orthovanadate (Nd:YVO$_4$) laser, neodymium glass (Nd:glass) laser, neodymium YLF (Nd:YLF) solid-state laser, promethium 147 doped phosphate glass (147Pm$^{3+}$:glass) solid-state laser, ruby laser (Al$_2$O$_3$:Cr$^{3+}$), thulium YAG (Tm:YAG) laser, titanium sapphire (Ti:sapphire; Al$_2$O$_3$:Ti$^{3+}$) laser, trivalent uranium doped calcium fluoride (U:CaF$_2$) solid-state laser, Ytterbium doped glass laser (rod, plate/chip, and fiber), Ytterbium YAG (Yb:YAG) laser, Yb$_2$O$_3$ (glass or ceramics) laser, etc. In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

A laser may be combined with an upconverter in order to arrive at shorter (laser) wavelengths. For instance, with some (trivalent) rare earth ions upconversion may be obtained or with non-linear crystals upconversion can be obtained. Alternatively, a laser can be combined with a downconverter, such as a dye laser, to arrive at longer (laser) wavelengths.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light. The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape,) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT (room temperature), such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

In embodiments, laser light sources may be arranged in a laser bank. The laser bank may in embodiments comprise heat sinking and/or optics e.g. a lens to collimate the laser light. A laser bank may e.g. comprise at least 10, such as at least 20 laser light sources.

The light source is configured to generate light source light. The light source is especially selected to provide light source light that can excite the luminescent material. For instance, in embodiments the light source light may be blue light, as blue light can excite a number of possible garnet type materials. However, other wavelengths than blue may also be possible. For instance, in embodiments the light source light may be ultraviolet or green. Different light sources configured to generate spectrally different light source light may also be possible.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

Especially, the light source is configured to generate (laser) light source light, and the luminescent body, is especially configured in a light receiving relationship with the light source.

The terms "radiationally coupled" or "optically coupled" may especially mean that (i) a light generating element, such as a (laser) light source, and (ii) another item or material, are associated with each other so that at least part of the radiation emitted by the light generating element is received by the item or material. In other words, the item or material is configured in a light-receiving relationship with the light generating element. At least part of the radiation of the light generating element will be received by the item or material. This may in embodiments be directly, such as the item or material in physical contact with the (light emitting surface of the) light generating element. This may in embodiments be via a medium, like air, a gas, or a liquid or solid light guiding material. In embodiments, also one or more optics, like a lens, a reflector, an optical filter, may be configured in the optical path between light generating element and item or material.

Herein, the invention is further described in relation to a laser light source as light source.

As indicated above, the n laser light sources are configured to generate laser light source light. Especially, the laser light source light is visible light. In yet further specific embodiments, the light source light, especially the laser light source light, is blue light.

The terms "visible", "visible light" or "visible emission" and similar terms refer to light having one or more wavelengths in the range of about 380-780 nm. Herein, UV may especially refer to a wavelength selected from the range of 200-380 nm. The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light. The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The term "cyan" may refer to one or more wavelengths selected from the range of about 490-520 nm. The term "amber" may refer to one or more wavelengths selected from the range of about 585-605 nm, such as about 590-600 nm.

As indicated above, the light generating device (further) comprises focusing optics. As above indicated, the laser light may be collimated with a lens, though this is not necessary. The focusing optics as described herein is at least comprised by the light generating device. This focusing optics may be used to focus the diverging laser light source light or to focus the (already) collimated laser light source light. In this way, a spot of laser light source light may be created on the luminescent body (see further also below).

In embodiments, the focusing optics may comprise one or more lenses. Hence, in embodiments, the focusing optics may be of the transmissive type. In such embodiments, the focusing optics are configured to focus the laser light source light into a focused beam of laser light source light. As will be discussed below, in embodiments, each laser light source may comprise its respective focusing optics. Hence, in embodiments the device may comprise n laser light sources and n focusing optics. In alternative embodiments, the device comprises n laser light sources and less than n focusing optics, like e.g. 0.5*n or less. For instance, two laser light sources may be configured upstream of the same focusing optics, and may generate two spots on the luminescent body.

In embodiments, the reflective focusing optics may comprise one or more reflectors. Hence, in embodiments, the reflective focusing optics may be of the reflective type. In such embodiments, the reflective focusing optics are configured to reflect and focus the laser light source light into a focused beam of laser light source light. As will be discussed below, in embodiments, each laser light source may comprise its respective reflective focusing optics. Hence, in embodiments the device may comprise n laser light sources and n reflective focusing optics. In alternative embodiments, the device comprises n laser light sources and less than n reflective focusing optics, like e.g. 0.5*n or less. For instance, two laser light sources may be configured upstream of the same reflective focusing optics, and may generate two spots on the luminescent body.

Hence, in specific embodiments, the focusing optics comprise reflective focusing optics. Especially such optics allow a good focusing and a compact light generating devices. In specific embodiments, the reflective focusing optics are (thus) configured to reflect and focus the laser light source light into a focused beam of laser light source light. In yet further specific embodiments, the focusing optics may be selected from the group of parabolic mirrors and ellipsoid mirrors. Alternatively or additionally, in further specific embodiments, the focusing optics may be selected from the group free-shaped mirrors, e.g. to customize the exact shape of the focus on the luminescent body.

In specific embodiments, the focusing optics may be selected from ellipsoid mirrors. An Ellipse curve is a Cartesian oval, a set of points that have the same linear combination of distances from two fixed points. An ellipsoid is an ellipse curve rotated in space around its long axis. An ellipsoid mirror may especially have two focal points. Light exiting from the first focal point is focused onto the second focal point. In the present case, a laser is positioned in the first focal point, and the laser light is focused onto the phosphor in the second focal point. The distance between the focal points (focal distance) can be chosen by the dimensions of the ellipsoid. In the case of the laser with a limited radiation angle, only a small part of the ellipsoid may be needed to reflect all the light and focus it onto the phosphor.

As indicated above, in embodiments each laser light source may comprise its respective focusing optics, especially its respective reflective focusing optics. This may allow providing the laser light source and respective optics as single unit. Such single unit may be easily replace and facilitate adjustment, as the light source and optics are not separate units. Hence, in embodiments the light generating device comprises n lighting units, wherein each of the n lighting units comprises (i) the laser light source configured to generate the laser light source light and (ii) focusing optics configured to (reflect and) focus the laser light source light into a focused beam of laser light source light.

When the number of focusing optics is at least 4, like especially at least 8, the focusing optics may be configured in a ring shape. The series of at least 4 focusing optics may be configured around the luminescent body but will in general be configured at some distance from the luminescent body (i.e. over the luminescent body, optionally with some lateral displacement relative to the luminescent body).

As indicated above, in embodiments the light generating device comprises two or more laser light sources. Hence, in embodiments n≥2. Especially, however, in embodiments n≥4, such as selected from the range of 4-576, like 8-256. However, more than 576 laser light sources is herein not excluded. Especially, however, n may be selected from the range of 8-256, such as up to 64.

When n≥4, especially when n≥8, the (laser) light sources may be configured in a ring shape around the luminescent body.

Especially, in embodiments the laser light sources are configured to generate laser light source light having the same color point. In specific embodiments, colors or color points of a first type of light and a second type of light may be essentially the same when the respective color points of the first type of light and the second type of light differ with at maximum 0.03 for u' and/or with least 0.03 for v', even more especially at maximum 0.02 for u' and/or with least 0.02 for v'. In yet more specific embodiments, the respective color points of first type of light and the second type of light may differ with at maximum 0.01 for u' and/or with least 0.01 for v'. Here, u' and v' are color coordinate of the light in the CIE 1976 UCS (uniform chromaticity scale) diagram. In specific embodiments, the laser light sources may be of the same bin.

As indicated above, the light generating device further comprises a luminescent body. Especially, the luminescent body comprises a luminescent material, wherein the luminescent body is configured in a light receiving relationship with the n laser light sources, wherein the luminescent material is configured to convert at least part of the laser light source light into luminescent material light. Especially, the luminescent material light comprises visible light, such as having a color point in the yellow or green.

The term "luminescent material" herein especially relates to inorganic luminescent materials, which are also sometimes indicated as phosphors. These terms are known to the person skilled in the art.

In embodiments, quantum dots and/or organic dyes may be applied, and may optionally be embedded in transmissive matrices like e.g. polymers, like PMMA, or polysiloxanes, etc. etc. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore, the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content. Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nano-wires, etcetera. Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170. Quantum confinement structures may thus also be converter elements. The organic luminescent materials, such as afore-mentioned dyes, or more especially specific (functional) groups thereof, may thus also be converter elements. Elements like (trivalent) Ce and divalent Eu are in the art also indicates as activators or activator elements or "dopants". Hence, especially the luminescent material is or comprises a converter element.

As indicated above, the light generating device especially further comprises a luminescent material configured to convert at least part of the light source light into luminescent material light having an emission band having wavelengths in one or more of (a) the green spectral wavelength range and (b) the yellow spectral wavelength range.

The term "luminescent material" especially refers to a material that can convert first radiation, especially (one or more of UV radiation and) blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion. In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex}<\lambda_{em}$), though in specific embodiments the luminescent material may comprise down-converter luminescent material, i.e. radiation of a larger wavelength is converted into radiation with a smaller wavelength ($\lambda_{ex}>\lambda_{em}$). In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials. The term "luminescent material" herein may also refer to a material comprising a luminescent material, such as a light transmissive host comprising the luminescent material.

Especially, the luminescent material is configured to convert at least part of the light source light into luminescent material light having an emission band having wavelengths in one or more of (a) the green spectral wavelength range and (b) the yellow spectral wavelength range, wherein the luminescent material comprises a (garnet) luminescent material of the type $A_3B_5O_{12}$:Ce, wherein A comprises one or more of Y, La, Gd, Tb and Lu, and wherein B comprises one or more of Al, Ga, In and Sc. Hence, the luminescent material light may e.g. green light or yellow light (or in specific embodiments even orange (dependent upon the composition of the garnet and cerium concentration)). However, other embodiments are also possible, see below. In embodiments, 0.05-10% of the A elements comprise Ce, even more especially 0.05-5%, such as 0.1-5%. Especially, embodiments, 0.1-3% of the A elements comprise Ce, such as up to 2%, like selected from the range of 0.1-1.5%, such as at least above 0.5%.

Especially, a luminescent material comprises conversion material or is a conversion material. A luminescent material converts light from a light source, such as the light source light, into secondary light (here the luminescent material light). The luminescent material may comprise an organic group that converts the light, or a molecule that converts the light, or an inorganic group that converts the light, etc. Such groups (or molecule) may be indicated as converter element. The garnet type material as indicated above, comprises cerium (Ce) as converter element. Cerium comprising garnets are well known in the art.

Hence, in specific embodiments the luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A'_{x2}Ce_{x3})_3(Al_{y1-y2}B'_{y2})_5O_{12}$, wherein x1+x2+x3=1, wherein x3>0, wherein 0<x2+x3≤0.2, wherein y1+y2=1, wherein 0≤y2≤0.2, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially x1>0, such as >0.2, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein 0<x2+x3≤0.1, and wherein 0≤y2≤0.1. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein x1+x3=1, and wherein 0<x3≤0.2, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein x1+x2+x3=1, wherein x3>0, wherein 0<x2+x3≤0.2, wherein y1+y2=1, wherein 0≤y2≤0.2. Especially, x3 is selected from the range of 0.001-0.1. Note that in embodiments x2=0. Alternatively or additionally, in embodiments y2=0.

In specific embodiments, A may especially comprise at least Y, and B may especially comprise at least Al.

The garnet type luminescent material may also be described with an alternative formula $A_3B'_2C''_3O_{12}$. Here, A may comprise one or more of (i) rare earth ions, such as one or more selected from $Y^{3+}$, $Lu^{3+}$, $Tb^{3+}$, $La_{3+}$, and (ii) divalent cations, such as $Ca^{2+}$. Here, B may comprise one or more of (i) trivalent cations, such as one or more of $Al_{3+}$, $Ga^{3+}$, $Sb^{3+}$, and $In^{3+}$, and (ii) divalent cations, such as one or more of $Mg^{2+}$ and $Mn^{2+}$. Here, C may comprise one or more of (i) trivalent cations, such as one or more of $Ga^{3+}$ and $Al^{3+}$, (ii) divalent cations, such as $Mn^{2+}$, and (iii) tetravalent cations, such as one or more of $Si^{4+}$ and $Ge^{4+}$. With such ions, the garnet crystal structure can be maintained. Other substitutions than mentioned may also be possible.

Alternatively or additionally, the luminescent material may e.g. be $M_2Si_5N_8$:$Eu^{2+}$ and/or $MAlSiN_3$:$Eu^{2+}$ and/or $Ca_2AlSi_3O_2N_5$:$Eu^{2+}$, etc., wherein M comprises one or more of Ba, Sr and Ca, especially in embodiments at least Sr. In specific embodiments, the first luminescent may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in $CaAlSiN_3$:Eu, the correct formula could be $(Ca_{0.98}Eu_{0.02})AlSiN_3$. Divalent europium will in general replace divalent cations, such as the above divalent alkaline earth cations, especially Ca, Sr, or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba,Sr,Ca)_2Si_5N_8$:Eu can also be indicated as $M_2Si_5N_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8$:Eu (i.e. 75% Ba; 25% Sr). Here, Eu is introduced and replaces at least part of M, i.e. one or more of Ba, Sr, and Ca). Likewise, the material (Ba,Sr,Ca)$AlSiN_3$:Eu can also be indicated as $MAlSiN_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art. Hence, such nitride luminescent materials may also be or comprise converter elements, here especially $Eu^{2+}$.

Especially, the luminescent material may be an inorganic luminescent material, such as one or more of the above-described trivalent cerium or divalent europium comprising oxides, oxynitrides, or nitrides.

The luminescent material is configured to convert at least part of first radiation (selected from one or more of UV radiation and visible radiation), into luminescent material light. Especially, in embodiments the luminescent material may be configured to convert at least part of blue light (as radiation) into luminescent material light. Especially when blue light is partly converted, the blue light may be used as a source of blue light (for the device light) and as excitation light that can be converted by the luminescent material. The first radiation may especially be provided by a (solid state) light source, see further below.

When different luminescent materials are applied, one or more luminescent materials may be configured to convert laser light source light into one or more of green and yellow luminescent material light, and one or more other luminescent materials may be configured to convert laser light source light into one or more of orange and red luminescent material light.

In specific embodiments, the luminescent body comprises a ceramic body comprising the luminescent material. Alternatively, the luminescent body comprises single crystal. In yet further specific embodiments, different types of luminescent bodies may be applied. Hence, the body may especially be selected from single crystalline bodies and ceramic bodies. The latter may be more easily made than the former, while they nevertheless may have good optical and/or thermal properties. Hence, in embodiments the body may be a ceramic body. However, in specific embodiments also a combination of single crystalline bodies and ceramic bodies may be applied. Especially, the luminescent body comprises a ceramic luminescent body. Hence, in specific embodiments the luminescent body is defined by a ceramic luminescent material. Therefore, in specific embodiments the luminescent material is a luminescent material that can be provided a ceramic luminescent body. Hence, the luminescent body may comprise a ceramic luminescent body.

Many of the above described luminescent materials, especially the garnet materials, can be provided as ceramics (ceramic body or ceramic slab). At least this applies for the above described $A_3B_5O_{12}$:Ce, or with an alternative formula described $A_3B'_2C''_3O_{12}$:Ce (see also below).

Ceramic bodies are known in the art. Especially, the ceramic material may be obtainable by a sintering process and/or a hot-pressing process, optionally followed by an annealing in an (slightly) oxidizing atmosphere. The term "ceramic" especially relates to an inorganic material that is—amongst others—obtainable by heating a (poly crystalline) powder at a temperature of at least 500° C., especially at least 800° C., such as at least 1000° C., like at least 1400° C., under reduced pressure, atmospheric pressure or high pressure, such as in the range of 10' to 500 MPa, such as especially at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing). A ceramic especially has density that is at least 90% (or higher, see below), such as at least 95%, like in the range of 97-100%, of theoretical density (i.e. the density of a single crystal). A ceramic may still be polycrystalline, but with a reduced, or strongly reduced volume between grains (pressed particles or pressed agglomerate particles). The heating under elevated pressure, such as HIP, may e.g. be performed in an inert gas, such as comprising one or more of $N_2$ and argon (Ar). Especially, the heating under elevated pressures is preceded by a sintering process at a temperature selected from the range of 1400-1900° C., such as 1500-1800° C. Such sintering may be performed under reduced pressure, such as at a pressure of $10^{-2}$ Pa or lower. Such sintering may already lead to a density of in the order of at least 95%, even more especially at least 99%, of theoretical density. After both the pre-sintering and the heating, especially under elevated pressure, such as HIP, the density of the light transmissive body can be close to the density of a single crystal. However, a difference is that grain boundaries are available in the light transmissive body, as the light transmissive body is polycrystalline. Such grain boundaries can e.g. be detected by optical microscopy or SEM. Hence, herein the light transmissive body especially refers to a sintered polycrystalline having a density substantially identical to a single crystal (of the same material). Such body may thus be highly transparent for visible light (except for the absorption by the light absorbing species such as especially $Ce^{3+}$).

In embodiments, the body has lateral dimensions width or length (W or L) or diameter (D) and a thickness or height (H). In embodiments, (i) D≥H or (ii) and W≥H and/or L≥H. The luminescent tile may be transparent or light scattering. In embodiments, the tile may comprise a ceramic luminescent material. In specific embodiments, L≤10 mm, such as especially L≤5 mm, more especially L≤3 mm, most especially L≤2 mm. In specific embodiments, W≤10 mm, such as especially W≤5 mm, more especially W≤3 mm, most especially W≤2 mm. In specific embodiments, H≤10 mm, such as especially H≤5 mm, more especially H≤3 mm, most especially H≤2 mm. In specific embodiments, D≤10 mm, such as especially D≤5 mm, more especially D≤3 mm, most especially D≤2 mm. In specific embodiments, the body may have in embodiments a thickness in the range 50 μm-1 mm. Further, the body may have lateral dimensions (width/diameter) in the range 100 μm-10 mm. In yet further specific embodiments, (i) D>H or (ii) W>H and W>H. Especially, the lateral dimensions like length, width, and diameter are at least 2 times, like at least 5 times, larger than the height. Herein, the height of the luminescent body is also indicated with Hl.

The plurality of luminescent bodies may include bodies that have individual dimensions that are smaller than of body describe above. In embodiments, however, the general ratios of the dimensions may apply as well.

In specific embodiments, when a plurality of (smaller) luminescent bodies are applied, the bodies may have cross-section selected from e.g. circular, triangular, square, rectangular (but not square), pentagonal, hexagonal, octagonal, decagonal, etc. Here, the cross-section especially refers to a cross-section perpendicular to the height and/or parallel to the thermally conductive support. Especially, in embodiments the height (H) is selected from the range of 30 μm-10 mm. Even more especially, the height may be selected from the range of 50 μm-2 mm, such as especially 50 μm-1 mm, such as 0.5 mm or smaller. When the luminescent body has a length and a width, like in (non-square) rectangular embodiments, the length and width may have a ratio selected from the range of 1:5-5:1, such as 1:2-2:1. In embodiments, the bodies have a lateral dimension width or length (W or L) or diameter (D) and a thickness or height (H). In embodiments, (i) D≥H or (ii) and W≥H and/or L≥H. Within the plurality of bodies, two or more bodies may have essentially the same dimensions. Alternatively or additionally, within the plurality of bodies, two or more bodies may have different dimensions. In embodiments, all bodies within the plurality of bodies have essentially the same dimensions. In yet other embodiments, within the plurality of bodies have the same dimensions there are n subsets, wherein each subset comprises a plurality of bodies having essentially the same dimensions, but wherein bodies of different subsets have one or more mutually differing dimension. The number n of subsets may be selected from the range of 2-8, such as 2-4. In specific embodiments, however, the plurality of element bodies have identical cross-sectional dimensions. The plurality of bodies may comprise at least 4 bodies, even more especially at least 8. In embodiments, the number of bodies may be selected from the range of 8-900, such as 8-400, though even more may be possible. Hence, when two or more different types of element bodies are applied, in embodiments the total number of bodies may be up to about 900, such as up to about 400. For each of the luminescent bodies (from the plurality of (smaller) luminescent bodies) at least two of n laser light sources, together with the focusing optics, are configured to provide in the operational mode light spots of laser light source light on the respective luminescent body.

As indicated above, especially the n laser light sources and focusing optics are configured to provide in an operational mode light spots of laser light source light on the luminescent body. In embodiment, such spots (having intensity of at least 10% of the maximum intensity) may e.g. have sizes of about 0.25 mm² to 25 mm², though other dimensions may also be possible. Relative to the total area of the luminescent body, all spots together may irradiate at least 10% of a first face area (see also above) of the luminescent body, such as selected from the range of 10-100%.

Especially, there are k sets of light spots each have an individually selected number of m light spots. This may imply that there may be different sets with mutually differing numbers of m light spots. In specific embodiments, wherein k is at least two, each of the sets may include the same number of m light spots. Especially two or more of the light spots within each set have a partial overlap. Due to the partial overlap, there is a better illumination of the total area (of the first face) of the luminescent body one the one hand, but on the other hand, a pixelated light source may be provided. Further, in specific embodiments 2≤m≤n. Yet further, in specific embodiments 1≤k<n, even more especially 2≤k<n.

The spot area (of each spot) may be defined in different ways. The spot may have a maximum intensity, which is indicated with 100%, may be easily determined with method known in the art, like e.g. a CCD camera. However, at very low intensity, the boundary of the spot may be a bit more difficult to determine. Hence, herein as least the definition of the first spot area is applied. The first spot area is defined by 10-100% of the maximum intensity in the light spot. Herein, also a second spot area is defined; however, for other purposes (see below).

As indicated above, there should in embodiments be partial overlap. Hence, in such embodiments there is no full overlap but there is also not zero overlap. To determine the overlap, the 10-100% definition, i.e. the first spot area, is used for each spot.

Especially, there is partial overlap in embodiments wherein for at least one of the light spots within at least one of the k sets applies that in the range of 5-80% of its first spot area overlaps with at least another first spot area within the set. Even more especially, in embodiments for at least one of the light spots within a plurality of the k sets (i.e. k is at least 2) applies that in the range of 5-80% of its first spot area overlaps with at least another first spot area within the set. In yet further specific embodiments, for each spot may apply that 5-80% of its first spot area overlaps with at least another first spot area.

In specific embodiments, for at least one of the light spots within at least one of the k sets applies that in the range of 20-70% of its first spot area overlaps with at least another first spot area within the set. Even more especially, in embodiments for at least one of the light spots within a plurality of the k sets (i.e. k is at least 2) applies that in the range of 20-70% of its first spot area overlaps with at least another first spot area within the set. In yet further specific embodiments, for each spot may apply that 20-70% of its first spot area overlaps with at least another first spot area.

Yet even more especially, in embodiments for at least one of the light spots within at least one of the k sets applies that in the range of 30-60% of its first spot area overlaps with at least another first spot area within the set. Even more especially, in embodiments for at least one of the light spots within a plurality of the k sets (i.e. k is at least 2) applies that in the range of 30-60% of its first spot area overlaps with at least another first spot area within the set. In yet further specific embodiments, for each spot may apply that 30-60% of its first spot area overlaps with at least another first spot area.

As indicated above, in embodiments there may not be full overlap. This may further be illustrated with the second spot area. The second spot area is defined by 50-100% of the maximum intensity in the light spot. This is a smaller area of the spot, as the entire area of the second spot area has an intensity of at least 50% of the maximum intensity, whereas for the first spot area the lower threshold value is "only" 10%. The overlap of the second spot areas may in embodiments not be too large, as otherwise the pixilation may be less clear. Hence, in specific embodiments for at least one of the light spots within at least one of the k sets applies that in the range of 0-60% of its second spot area overlaps with at least another second spot area within the set. In yet further specific embodiments for at least one of the light spots within a plurality of the k sets (i.e. k is at least 2) applies that in the range of 0-60% of its second spot area overlaps with at least another second spot area within the set. Yet even more especially, in embodiments for each light spot may apply that in the range of 0-60% of its second spot area overlaps with at least another second spot area within the set.

More especially, in specific embodiments for at least one of the light spots within at least one of the k sets applies that in the range of 0-30% of its second spot area overlaps with at least another second spot area within the set. In yet further specific embodiments for at least one of the light spots within a plurality of the k sets (i.e. k is at least 2) applies that in the range of 0-30% of its second spot area overlaps with at least another second spot area within the set. Yet even more especially, in embodiments for each light spot may apply that in the range of 0-30% of its second spot area overlaps with at least another second spot area within the set.

Yet even more especially, in specific embodiments for at least one of the light spots within at least one of the k sets applies that in the range of 2-20% of its second spot area overlaps with at least another second spot area within the set. In yet further specific embodiments for at least one of the light spots within a plurality of the k sets (i.e. k is at least 2) applies that in the range of 2-20% of its second spot area overlaps with at least another second spot area within the set. Yet even more especially, in embodiments for each light spot may apply that in the range of 2-20% of its second spot area overlaps with at least another second spot area within the set.

A third spot area may be defined by 2-100% of the maximum intensity in the light spot. Especially, there is partial overlap in embodiments wherein for at least one of the light spots within at least one of the k sets applies that in the range of 5-80% of its third spot area overlaps with at least another third spot area within the set. Even more especially, in embodiments for at least one of the light spots within a plurality of the k sets (i.e. k is at least 2) applies that in the range of 5-80% of its third spot area overlaps with at least another third spot area within the set. In yet further specific embodiments, for each spot may apply that 5-80% of its third spot area overlaps with at least another third spot area.

Especially for Gaussian shaped power distributions of the spots, in embodiments the overlap of the first areas may be selected from the range of 5-40%, such as up to about 35%. Further, in embodiments for Gaussian shaped power distributions of the spots the overlap of the second areas may be selected from the range of 0-5%, such as essentially 0%. Yet further, for Gaussian shaped power distributions of the spots, in embodiments the overlap of the third areas may be selected from the range of 5-50%, such as up to about 40%.

In specific embodiments, however, there may also be one or more spots in the operational mode, that has essentially no overlap of its first spot area with any of the other first spot areas. Hence, in specific embodiments for at least one of the light spots applies that its first spot area as defined in claim 2, does not overlap with at least another first spot area.

As indicated above, a pixilated device may be provided. This may especially imply that during one or more operational modes of the light generating device, one or more pixels generate light. The term "pixels", and similar terms may especially refers to the spots (where the luminescent material light is generated). As indicated above, in an operational mode essentially all spots may be visible, whether or not overlapping. Further, as indicated above, the maximum number of spots is especially identical to the number of (laser) light sources. Hence, the pixilation may also be seen as a projected pixilation.

The pixilation may be a 1D pixilation, i.e. is a 1D array of spots. For instance, a 1D array may be provided of a plurality of spots, even more especially a plurality of sets of overlapping spots. The 1D array may comprise at least two pixels, even more especially at least four pixels. The pixilation may be 2D pixilation, i.e. is a 2D array of spots. For instance, a 2D array may be provided of a plurality of spots, even more especially a plurality of sets of overlapping spots. The 2D array may comprise at least four pixels, even more especially at least eight pixels. Further, especially each row and each column may each individually comprise at least two pixels.

The 2D array may have an essentially square, rectangular, hexagonal, round, oval, or other shape. Hence, the numbers of pixels in rows and columns may vary.

As indicated above, in embodiments the number of pixels may be n. In other embodiments, the number of pixels may be smaller than n. Especially, however, the minimum number of pixels when all (laser) light sources are switched on is larger than 2, such as equal to or larger than 4. As indicated above, in embodiments two or more of the n spots may partially overlap. Hence, in specific embodiments of al pixels, at least two partially overlap, even more especially at least four pixels overlap, e.g. in embodiments at least two sets of each two partially overlapping pixels. In yet further embodiments, at least three sets of each two or more partially overlapping pixels, are available.

In specific embodiments, the (maximum) power of the (laser) light sources is essentially the same, such as within +/−10% of an average power. Alternatively or additionally, the (maximum) intensity of the light source light on the phosphor in the respective pixels is essentially the same for all of the pixels, such as within +/−10% of an average power.

Alternatively, in embodiments the intensity of the light source light on the phosphor in the respective pixels may vary. For instance, the power may gradually decrease or increase over the luminescent body. For instance, a specific pattern may be provided. Applications may e.g. be selected from accent lighting, spot lighting, automotive lighting, shop lighting, shop window lighting, etc. This may e.g. be useful for specific desired intensity distributions, like e.g. in head lamps, or in lighting attributes such as a mannequin in a shop window, etc.

Note that there may be more operational modes than one operational mode (see further also below).

In embodiments, the light generating device may comprise a thermally conductive element, wherein the luminescent body is configured in thermal contact with the thermally conductive element.

Hence, the luminescent body may be configured in thermal contact with a thermally conductive element, such as a thermally conductive support. Especially, the support may be configured to support the luminescent body. In embodiments, the thermally conductive element may comprise a body, such as a body of thermally conductive material.

As will be further elucidated below, the body may in embodiments be in physical contact with the thermally conductive support. Alternatively or additionally, in embodiments the luminescent body may be in physical contact with a coating on the thermally conductive support. Also in this way, the luminescent body may be configured in thermal contact with the thermally conductive support.

In embodiments, the thermally conductive element may be a heatsink. In other embodiments, the thermally conductive element may be in thermal contact with a heatsink. Hence, in specific embodiments, the thermally conductive element comprises a heat sink.

A thermally conductive material may especially have a thermal conductivity of at least about 20 W/m/K, like at least about 30 W/m/K, such as at least about 100 W/m/K, like especially at least about 200 W/m/K. In yet further specific embodiments, a thermally conductive material may especially have a thermal conductivity of at least about 10 W/m/K.

In embodiments, the thermally conductive material may comprise of one or more of copper, aluminum, silver, gold, silicon carbide, aluminum nitride, boron nitride, aluminum silicon carbide, beryllium oxide, a silicon carbide composite, aluminum silicon carbide, a copper tungsten alloy, a copper molybdenum carbide, carbon, diamond, and graphite. Alternatively, or additionally, the thermally conductive material may comprise or consist of aluminum oxide. Herein, especially, however, the thermally conductive element comprises metal material. For instance, the metal material may comprise one or more of copper, aluminum, silver, gold, and a metal alloy. The metal alloy may comprise one or more of copper tungsten alloys, aluminum alloys, titanium alloys, etc. The thermally conductive element may be a heat sink or may be in thermal contact with a heat sink.

Heatsinks are known in the art. The term "heatsink" (or heat sink) may especially be a passive heat exchanger that transfers the heat generated by device, such as an electronic device or a mechanical device, to a fluid (cooling) medium, often air or a liquid coolant. Thereby, the heat is (at least partially) dissipated away from the device. A heat sink is especially designed to maximize its surface area in contact with the fluid cooling medium surrounding it. Hence, especially a heatsink may comprise a plurality of fins. For instance, the heatsink may be a body with a plurality of fins extending thereof. A heatsink especially comprises (more especially consists of) a thermally conductive material. The term "heatsink" may also refer to a plurality of (different) heatsinks.

An element may be considered in thermal contact with another element if it can exchange energy through the process of heat. Hence, the elements may be thermally coupled. In embodiments, thermal contact can be achieved by physical contact. In embodiments, thermal contact may be achieved via a thermally conductive material, such as a thermally conductive glue (or thermally conductive adhesive). Thermal contact may also be achieved between two elements when the two elements are arranged relative to each other at a distance of equal to or less than about 10 µm, though larger distances, such as up to 100 µm may be possible. The shorter the distance, the better the thermal contact. Especially, the distance is 10 µm or less, such as 5 µm or less. The distance may be the distanced between two respective surfaces of the respective elements. The distance may be an average distance. For instance, the two elements may be in physical contact at one or more, such as a plurality of positions, but at one or more, especially a plurality of other positions, the elements are not in physical contact. For instance, this may be the case when one or both elements have a rough surface. Hence, in embodiments in average the distance between the two elements may be 10 µm or less (though larger average distances may be possible, such as up to 100 µm). In embodiments, the two surfaces of the two elements may be kept at a distance with one or more distance holders.

The luminescent body may be supported by the thermally conductive element. To this end, the thermally conductive element may comprise a cavity, in which the element may be arranged. The fit between the cavity and the body may be a clearance fit, with minimal clearance. Alternatively or additionally, the luminescent body may be soldered to the thermally conductive element. To this end, the luminescent body may be provided with a coating layer for facilitating soldering and/or providing reflection. Such coating layer may e.g. comprise one or more of Ag and Al. An advantage of such layer is also that such layer is reflective for light. Alternatively or additionally, a chromium comprising layer, such as Cr metal layer, may be provided. Especially, such may facilitate soldering. Optionally, such coating layer may be a multi-layer, with on the reflective layer a further layer that may especially facilitate soldering. Such layer may e.g. comprise chromium. Hence, in embodiments one or more, especially a plurality, of luminescent body are attached to the thermally conductive element via a coating layer, such as a multi-layer. In specific embodiments, the multi-layer comprises a first layer comprising one or more of Al and Ag, a second layer comprising Cr, and a third layer being a solder layer. Such stack may be sandwiched by the element body, such as especially the first luminescent body, and the thermally conductive element.

Hence, in embodiments the one more side faces may be at least partly in thermal contact, or even physical contact, with the thermally conductive element. Alternatively or additionally, a layer may be provided on the thermally conductive element that is in contact with the one or more side faces. Especially, for essentially all side faces may apply that at least part thereof is not in physical contact with a coating and/or another element body. Therefore, in embodiments each of the plurality of luminescent body have one or more side faces, wherein for one or more side faces, especially a plurality, like essentially all, applies that part thereof is in contact with the thermally conductive element, or to a coating layer thereon, or to a reflective material.

As indicated above, in embodiments the coating layer may have reflective properties for one or more light source light and the luminescent material light. Yet further, in embodiments the thermally conductive element may have reflective properties for one or more light source light and the luminescent material light.

In embodiments, one or more the (laser) light sources are in thermal contact with the thermally conductive support. In specific embodiments, one or more, are in physical contact with the thermally conductive support. In specific embodiments, at least 25%, such as at least 50% of all (laser) light sources is in physical contact with the thermally conductive support. This may further allow a compact light generating device with efficient heat management.

The focusing optics may be position in embodiments slightly over the luminescent body. This may imply that part of the luminescent material light that escapes from the luminescent body may not leave the light generating device, or may not leave after transmission and/or reflection at or via the focusing optics. It may be desirable to minimize the presence of the optics in a line perpendicular to the luminescent body. Hence, in embodiments the luminescent body comprises a first face, wherein the n laser light sources together with the focusing optics, are configured to provide in the operational mode the light spots of laser light source light on the first face; wherein n≥4; wherein the n laser light sources, are configured around the first face; wherein the first face has a first area A1, wherein parallel to a normal to the first face the focusing optics have projections on the first face, wherein the projections have a total area A2, wherein A2/A1≤0.5, even more especially A2/A1≤0.3, yet even more especially A2/A1≤0.2, such as in embodiments A2/A1≤0.05. In specific embodiments, A2/A1=0. Hence, in embodiments an optical axis of the (laser) light source light has an angle α larger than 0° but less than 90° relative to normal to the luminescent body (especially its first face), such as selected from the range of 10-80°, like especially 20-70°, such as selected from the range of 55-65°.

Especially, the optical axis may be defined as an imaginary line that defines the path along which light propagates through a system starting from a light generating element, here especially the (laser) light source.

The light generating device with the optics also allows embodiments wherein the (laser) light sources may be configured at different distances from the luminescent body. This allows an even larger number of the (laser) light sources and thus a higher intensity of the luminescent material light and/or this allows further controlling the positioning of the spots on the first face. Hence, in embodiments the luminescent body comprises a first face, wherein the n laser light sources are configured at a lateral distance (d1) from the first face, wherein two or more sets of laser light sources have different lateral distances (d1). For instance, there may be 2-8 sets with 2-8 different lateral distances. Especially, there may be 2-4 sets with different lateral distances, like only 2 sets. In yet other embodiments, for all light sources the lateral distances may be essentially the same.

Alternatively or additionally, the light generating device with the optics also allows embodiments wherein the (laser) light sources may be configured at different heights relative to the first face of the luminescent body. This allows an even larger number of the (laser) light sources and thus a higher intensity of the luminescent material light and/or this allows further controlling the positioning of the spots on the first face. Hence, in embodiments the luminescent body comprises a first face, wherein the n laser light sources are configured at height relative to the first face, wherein two or more sets of laser light sources have different heights. For instance, there may be 2-8 sets with 2-8 different heights. Especially, there may be 2-4 sets with different heights relative to the first face, like only 2 sets. In yet other embodiments, for all light sources the heights relative to the first face may be essentially the same.

Whether or not different (laser) light sources are configured at different lateral distances from the luminescent body and/or configured at different heights relative to the first face of the luminescent body, but especially when different (laser) light sources are configured at different lateral distances from the luminescent body and/or configured at different heights relative to the first face of the luminescent body, the (laser) light source light of different (laser) light source may have different angles α relative to normal to the luminescent body (especially its first face). This allows further controlling the positioning of the spots on the first face. Hence, in embodiments two or more sets of (laser) light sources together with the (reflective) focusing optics may generate (laser) light source light having different optical axes angles relative to normal to the first face. For instance, there may be 2-8 sets with 2-8 different angles α of the optical axes with the normal to the first face. Especially, there may be 2-4 sets with different angles α of the optical axes with the normal to the first face, like only 2 sets. In yet other embodiments, for all light sources the angles α of the optical axes with the normal to the first face may be essentially the same.

For further thermal management, one may combine lasers for generating partially overlapping spots configured at different lateral distances and/or different heights and/or different positions around the luminescent body. Hence, adjacent (laser) light sources should not necessarily (though they may in other embodiments generate partially overlapping spots, but for instance oppositionally arranged (laser) light sources, configured at opposite sides of the first face of the luminescent body, may in embodiments generate partially overlapping spots. Many different embodiments may be possible. Hence, in specific embodiments, especially wherein n≥4, one or more sets of neighboring laser light sources, have no (partially) overlapping spots or have less overlap of spots than one or more sets of non-neighboring n laser light sources.

In specific embodiments, the light generating device may further comprise a control system configured to control the (n) (laser) light sources. Hence, in embodiments, the light generating device may further comprise a control system or may be functionally coupled to a control system. The control system may control the light sources. Especially when two or more light sources are available, a control system may be applied to control the two or more light sources (individually).

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability). Hence, in embodiments, the control system may control in dependence of one or more of an input signal of a user interface, a sensor signal (of a sensor), and a timer. The term "timer" may refer to a clock and/or a predetermined time scheme.

In specific embodiments, the light generating device is configured to generate device light comprising luminescent material light and unconverted laser light source light. For instance, in the reflective mode part of the (laser) light source light may be reflected at the luminescent body and propagate together with the luminescent material light away from the luminescent body. Also in the transmissive mode, part of the (laser) light source light may be transmitted and propagate together with the luminescent material light away from the luminescent body.

In specific embodiments, in the operational mode the light generating device is configured to generate white device light having a CRI of at least 80, more especially at least 85. Further, in specific embodiments the unconverted laser light source light comprises blue light (and the converted light may be yellow light).

Hence, in embodiments the white device light has a color rendering index (CRI) of at least 80, such as at least 85, like at least 90. Further, in embodiments the white device light may have a correlated color temperature (CCT) selected from the range of 1800-8000 K, such as 2000-6500 K, like for instance selected from the range of 2700-3000 K.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

Especially, in embodiments the light source comprises a laser light source.

The lumen equivalent of the white device light (escaping from the luminescent body) may in embodiments be selected from the range of 290-370 lm/W, such as 300-360 lm/W. In embodiments, the light generating device is configured to provide the luminescent light with power emitted from a radiation exit face of the luminescent body having a power density of 4 W/mm$^2$, especially a power density at least 7 W/mm$^2$, more especially at least 9 W/mm$^2$, even more especially at least 13 W/mm$^2$. Hence, in embodiments in an operational mode of the light generating device, the light generating device is configured to generate the luminescent material light from a radiation exit surface (or radiation exit face) of the luminescent converter with a power density of at least 4 W/mm$^2$. In yet further specific embodiments, the lighting device may be configured to provide luminescent light in combination with blue and/or red laser light coming out the same surface as the luminescent light providing white light with a brightness of at least 2000 lm/mm$^2$, more especially at least 3000 lm/mm$^2$, even more especially at least 6000 lm/mm$^2$ Herein, "lm" refers to lumen.

In yet a further aspect, the invention also provides a lamp or a luminaire comprising the light generating device as defined herein. The luminaire may further comprise a housing, optical elements, louvres, etc. etc. . . . . . In yet a further aspect, the invention also provides a projection device comprising the light generating device as defined herein. Especially, a projection device or "projector" or "image projector" may be an optical device that projects an image (or moving images) onto a surface, such as e.g. a projection screen. The projection device may include one or more light generating devices such as described herein.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting.

As indicated above, the lighting unit may be used as backlighting unit in an LCD display device. Hence, the invention also provides an LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
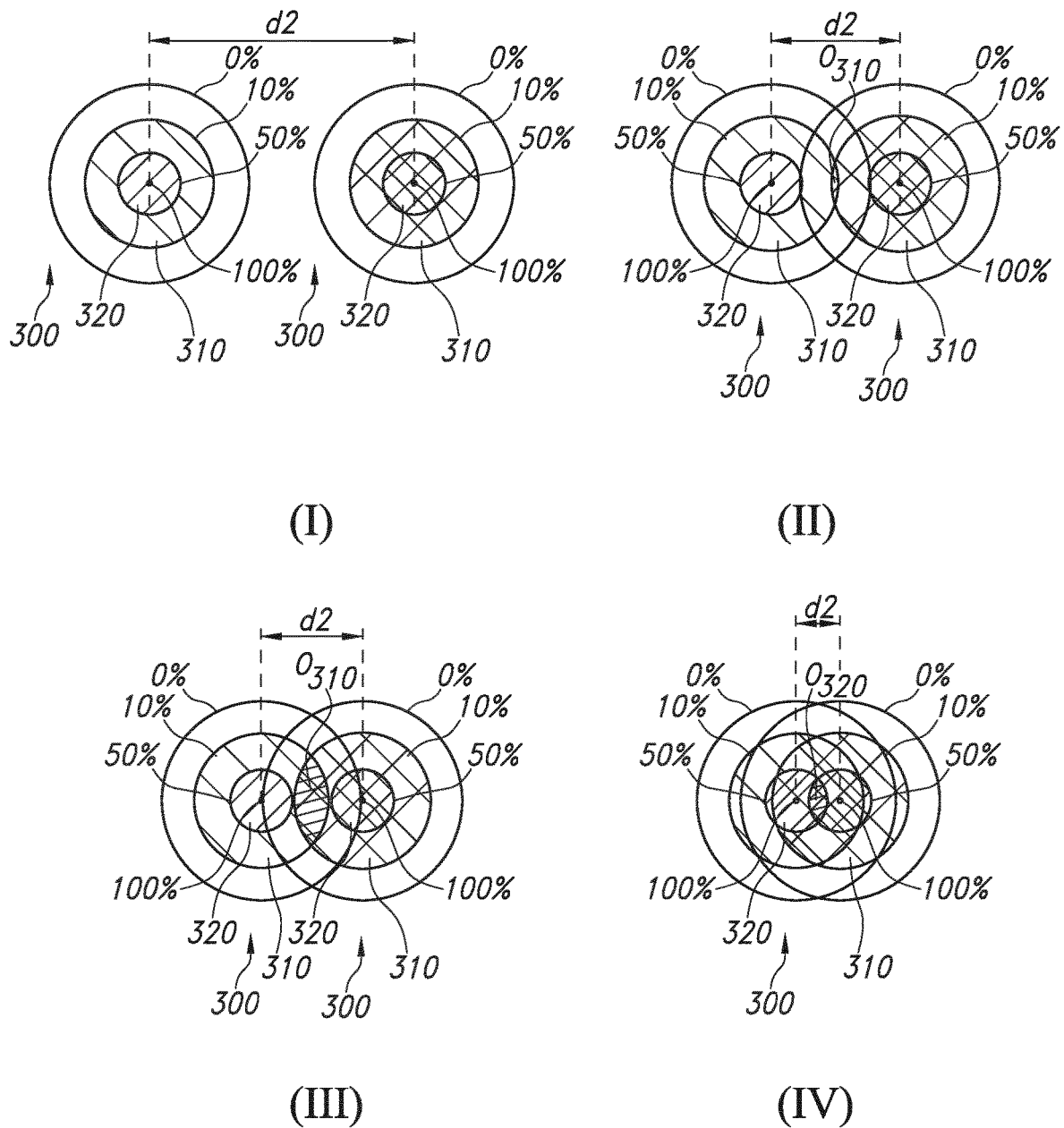
FIG. 1a-1b schematically depict some aspects.

FIG. 1a schematically depicts a number of arrangements of (laser) light spots. The spots 300 decrease intensity from a top of 100% to an area defined with a circle from where the intensity is 0%. From inside to outside, the first ring, indicated with 50%, defines the area in which the intensity is at least 50% of the maximum intensity of 100%. The second ring, indicated with 10%, defines the area in which the intensity is at least 10% of the maximum intensity of 100%. Hence, the area of the latter fully includes the area of the former. The area of the 10% ring is indicated as first spot area 310, and the area of the 50% ring is indicated as second spot area 310. Hence, the first spot area 310 is defined by 10-100% of the maximum intensity in the light spot 300, and the second spot area 320 is defined by 50-100% of the maximum intensity in the light spot 300.

Figure 1B:
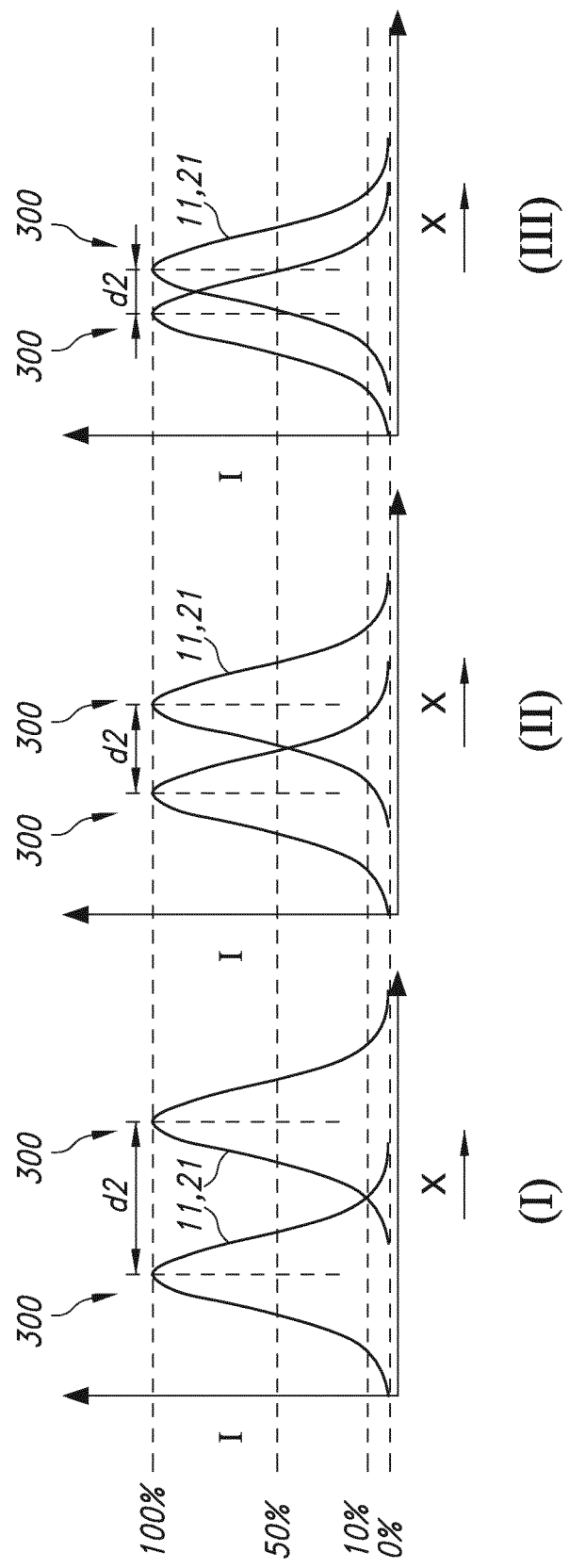

FIG. 1b schematically depicts four examples. In example I, there is no overlap of the spots 300. The spatial difference between the maxima of the spots 300 is indicated with d2. In example II there is no overlap of the second spot areas 320, but some overlap of the first spot areas 310, indicated with $O_{310}$. Here, d2 is decreased relative to example I. In the third example III, the overlap of the first spot areas 310, indicated with $O_{310}$, is larger than in the second example II. Here, d2 is decreased relative to example II. In the fourth example IV, the overlap of the first spot areas 310 is even larger than example III, and there is now also overlap between the second spot areas 320, indicated with $O_{320}$, which was not the case in the previous examples I-III. Here, d2 is further decreased relative to example III.

Herein, as also indicated above and as further also described below, in embodiments for at least one of the light spots 300 may apply that in the range of 5-80% of its first spot area 310 overlaps with at least another first spot area 310. Especially, the overlap is not too large in order to keep pixilation. Hence, in specific embodiments for one or more of the light spots 300 may apply that in the range of 0-60%, such as up to 20% of its second spot area 320 overlaps with at least another second spot area 320. Hence, more overlap than in example IV may be less desirable in embodiments.

FIG. 1b schematically depicts examples of the spots of laser light 11 or beam of focused laser light 21 (on a first face of the luminescent body) on an intensity scale along a length axis. Three examples are schematically depicted, with example I having a small overlap and example III having a relatively large overlap, even of the 50% or more intensity area, leading to a relatively small d2 value.

Figure 2A:
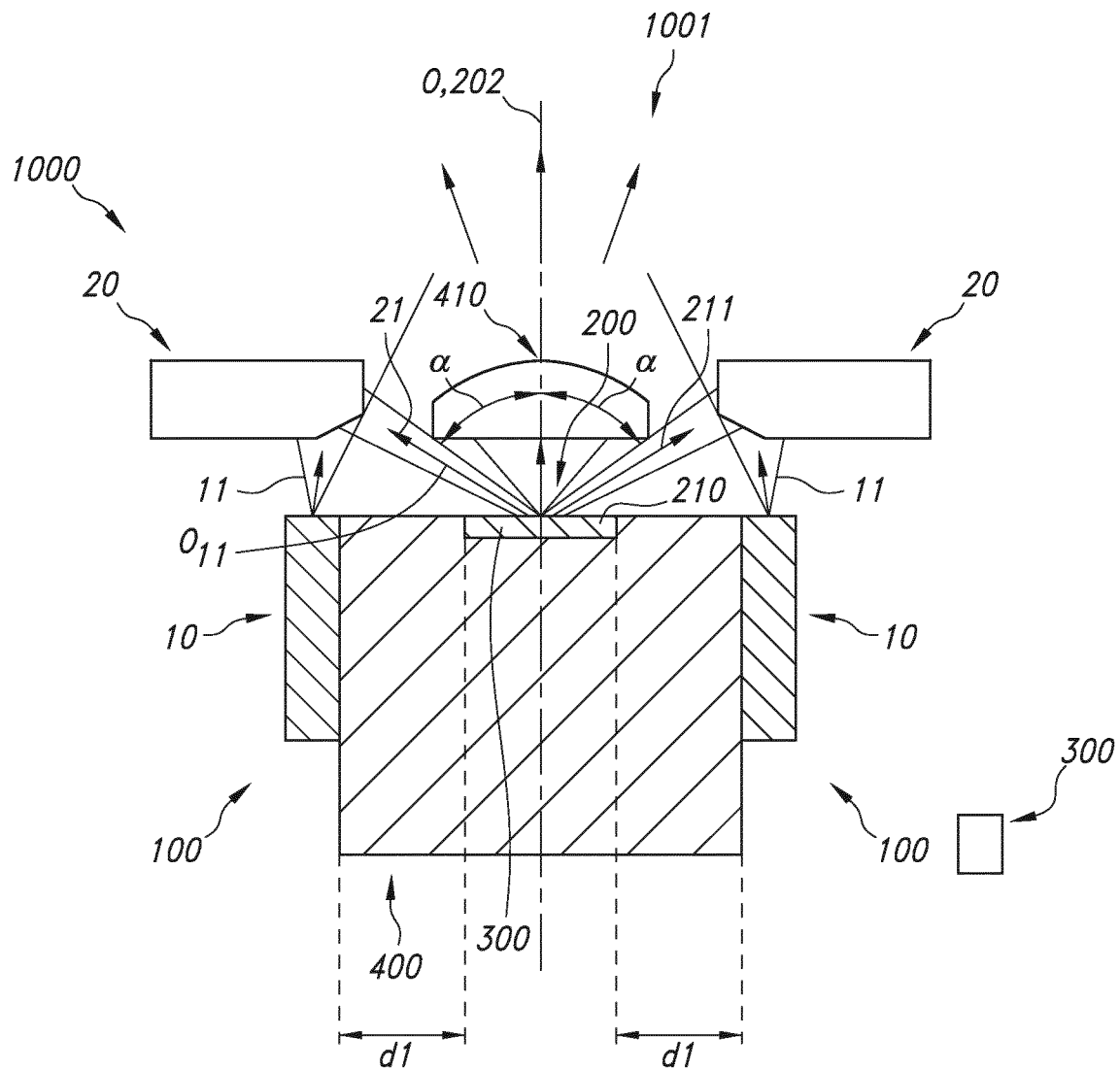
FIG. 2a-2d schematically depict some embodiments.

FIG. 2a schematically depicts an embodiment of a light generating device 1000 comprising n laser light sources 10, focusing optics 20, and a luminescent body 200. The n laser light sources 10 are configured to generate laser light source light 11. The focusing optics 20, here reflective focusing optics, are configured to focus the laser light source light 11 into a focused beam 21 of laser light source light 11. Especially n≥2; here by way of example n=2 light sources are schematically depicted.

The luminescent body 200 comprises a luminescent material 210. The luminescent body 200 is configured in a light receiving relationship with the n laser light sources 10. The luminescent material 210 is configured to convert at least part of the laser light source light 11, e.g. blue light, into luminescent material light 211, e.g. yellow light.

The n laser light sources 10 and focusing optics 20 are configured to provide in an operational mode light spots 300 of laser light source light 11 on the luminescent body 200. Here, in this schematic drawing the individual light spots are not discernible; see however above or below. In embodiments, the light spots have a partial overlap. Especially, at least one of the spots 300 applies that in the range of 5-80% of its first spot area 310 overlaps with at least another first spot area 310 (see also above).

In this embodiment, the focusing optics 20 comprise reflective focusing optics 20. The reflective focusing optics 20 are especially configured to reflect and focus the laser light source light 11 into a focused beam 21 of laser light source light 11. Especially, in embodiments the focusing optics 20 are selected from the group of parabolic mirrors and ellipsoid mirrors.

In embodiments, the laser light sources 10 may be configured to generate laser light source light 11 having essentially the same color point.

The light source 10 and optics 20 provide a spot 300 of light on a first surface 201 of the luminescent body 200.

The dashed line of perpendicular to the first face 201 is indicated as optical axis O of the device 1000 and/or as normal 202 to the first face 201.

In this schematically depicted embodiment, the light generating device 1000 comprises n lighting units 100. Each of the n lighting units 100 comprises the laser light source 10 configured to generate the laser light source light 11 and the focusing optics 20 configured to focus the laser light source light 11 into a focused beam 21 of laser light source light 11. Here, the laser light source 10 and optics 20 are not physically coupled, either directly or via one or more intermediate elements. However, this may be the case. This could provide e.g. a replaceable lighting unit 100.

The n laser light sources 10 are configured at a lateral distance d1 from the first face 201. Here, the lateral distances d1 are essentially the same.

In embodiments, the luminescent body 200 comprises a ceramic body comprising the luminescent material 210. In further specific embodiments, the luminescent material 210 comprises a luminescent material of the type $A_3B_5O_{12}$:Ce, wherein A comprises one or more of Y, La, Gd, Tb and Lu, and wherein B comprises one or more of Al, Ga, In and Sc.

Further, in embodiments the light generating device 1000 may comprise a thermally conductive element 400. The luminescent body 200 is configured in thermal contact with the thermally conductive element 400. Here, the thermal contact is obtained by physical contact.

Especially, the light generating device 1000 is configured to generate device light 1001 comprising luminescent material light 211 and optionally unconverted laser light source light 11. In specific embodiments, in the operational mode the light generating device 1000 is configured to generate white device light 1001 having a CRI of at least 80, such as at least 85. In such embodiments, the unconverted laser light source light 11 may comprise e.g. blue light. Here, the term "unconverted laser light source light 11" may especially refer to laser light source light 11 that is reflected and/or transmitted at the luminescent body.

Further, other light sources may be applied of which the light source light may bypass the luminescent material.

For beam shaping the device light 1001, an optical element 200, such as a lens and/or a collimator may be applied.

In embodiments, the light generating device 1000 may further comprise a control system 300 configured to control the laser light sources 10. In this way, the intensity of the device light may be controlled. When light sources have different color points of the light source light and/or when different parts of the luminescent body provide different types of luminescent material light and/or when different types of luminescent materials are applied in combination with different types of light sources, then also the spectral power distribution may be controlled.

Figure 2B:
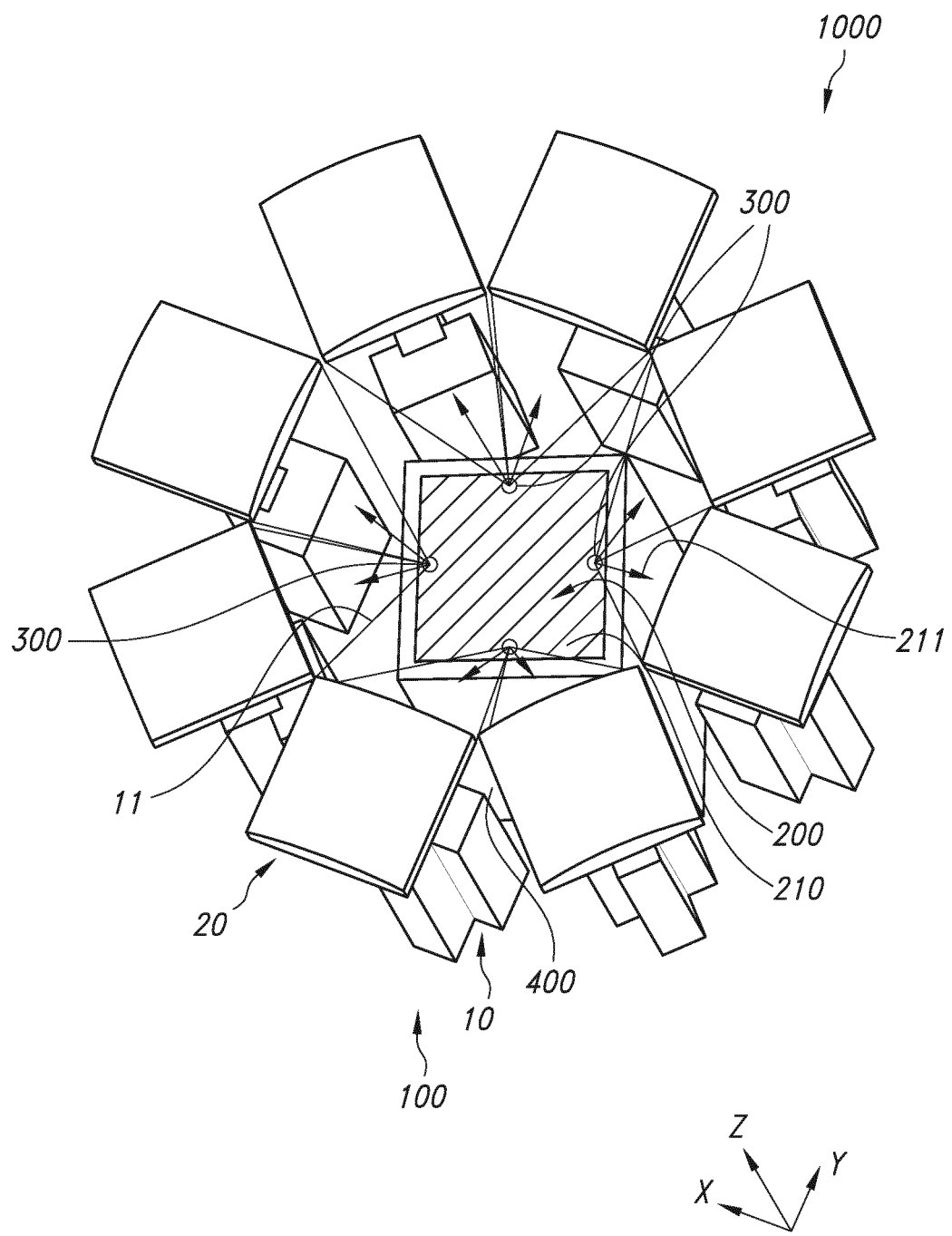

Referring to FIG. 2b schematically depicts an embodiment of the device 1000, wherein n=8. Note that in this embodiment the optics 20 are configured in a ring shape. The lateral distances (not shown) may be about the same, or even essentially the same in the schematically depicted embodiment. Further, the heights of the light sources 10 relative to the first face 201 may be the same (see e.g. also FIG. 2a), but may optionally also differ (not depicted in FIG. 2b).

Here, k sets of light spots 300 each have an individually selected number of m light spots 300, wherein two or more of the light spots 300 within each set have a partial overlap. In embodiments, n $2 \le m \le n$ and $1 \le k < n$. With reference to FIGS. 1a and 1b, a first spot area 310 is defined by 10-100% of the maximum intensity in the light spot 300, wherein— during the operational mode—for at least one of the light spots 300 within at least one of the k sets applies that in the range of 5-80% of its first spot area 310 overlaps with at least another first spot area 310 within the set.

Though not shown in this schematic drawing, in embodiments for at least one of the light spots 300 applies that its first spot area 310 as defined in claim 2, does not overlap with at least another first spot area 310.

Hence, FIG. 2b schematically depicts an embodiment wherein the luminescent body 200 comprises a first face 201, wherein the n laser light sources 10 together with the focusing optics 20, are configured to provide in the operational mode the light spots 300 of laser light source light 11 on the first face 201, wherein n≥4, and wherein the n laser light sources 10, are configured around the first face 201.

Figure 2C:
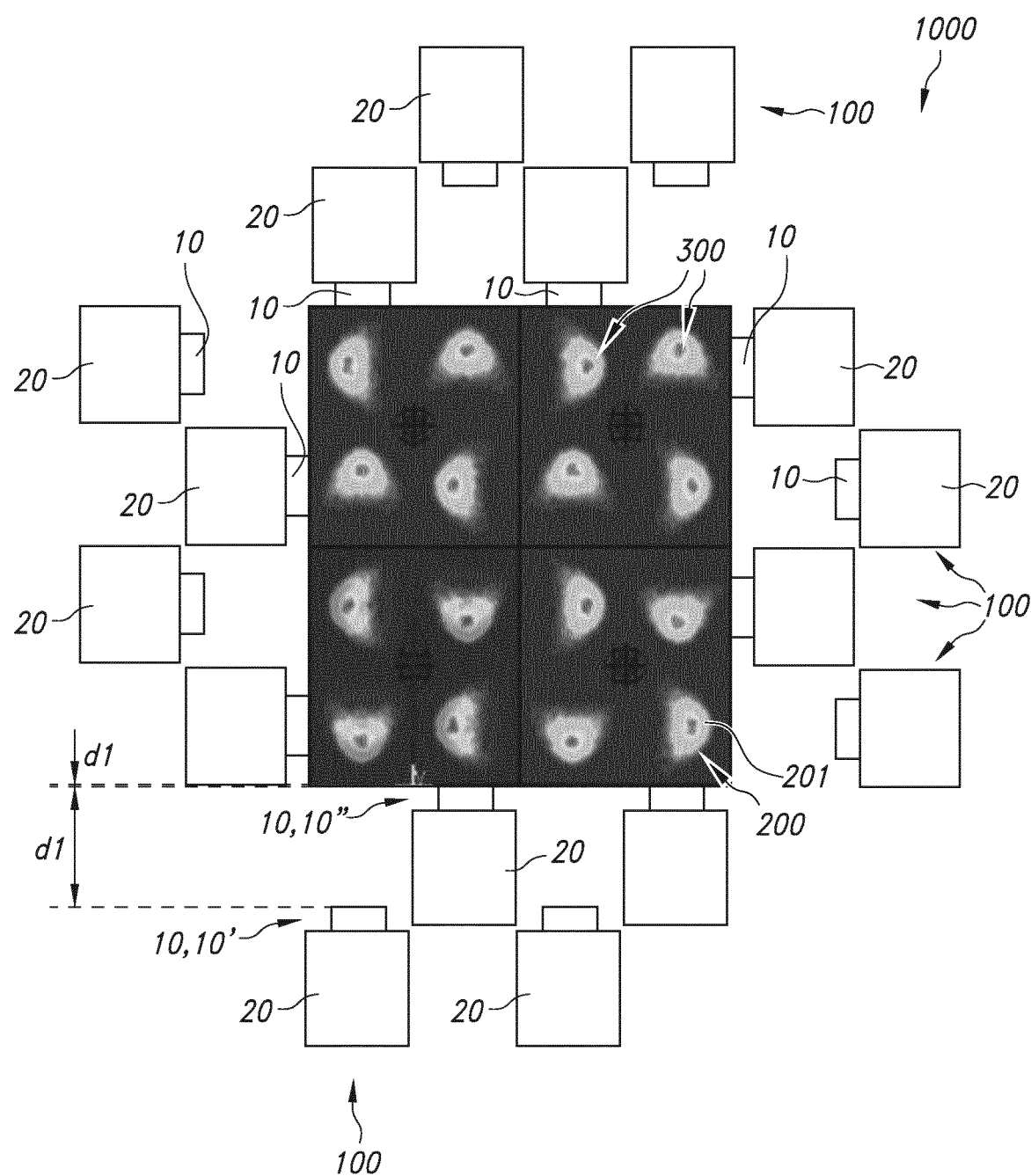

FIG. 2c schematically depicts an embodiment of the device 1000 in top view. Further, here also a luminescent body 200 is schematically depicted in fact comprising a plurality of luminescent bodies. Hence, a schematic embodiment is depicted wherein the light generating device 1000 comprises a plurality of luminescent bodies 200. Here, an embodiment is schematically depicted wherein for each of the luminescent bodies 200 at least two of n laser light sources 10, together with the focusing optics 20, are configured to provide in the operational mode light spots 300 of laser light source light 11 on the respective luminescent body 200.

In this embodiment, two (or more) sets of laser light sources 10 have different lateral distances d1. Note that also the heights may differ (not shown in this schematic drawing).

With e.g. the embodiment schematically depicted in FIG. 2c (but also e.g. FIG. 2b), one may choose that one or more sets of neighboring laser light sources 10, have no overlapping spots 300 or less overlap of spots 300 than one or more sets of non-neighboring n laser light sources 10. However, many other embodiments may be possible. Further, it is not excluded that one chooses that one or more sets of neighboring laser light sources 10 have overlapping spots 300 (see also FIG. 2d).

In FIG. 2c, the spots 300 are depicted as non-overlapping. However, in embodiments they may partially overlap.

FIG. 2c indicates twice the lateral distances d1. These lateral distances d1 are exemplary distances in relation to the light sources 10 at the bottom left, of which the left one is at the larger distance d1, whereas the right light source 10 has a lateral distance d1 relative to the luminescent body 200 of virtually zero.

In the embodiment schematically depicted in FIG. 2c, there are two sets of lateral distances d1.

Figure 2D:
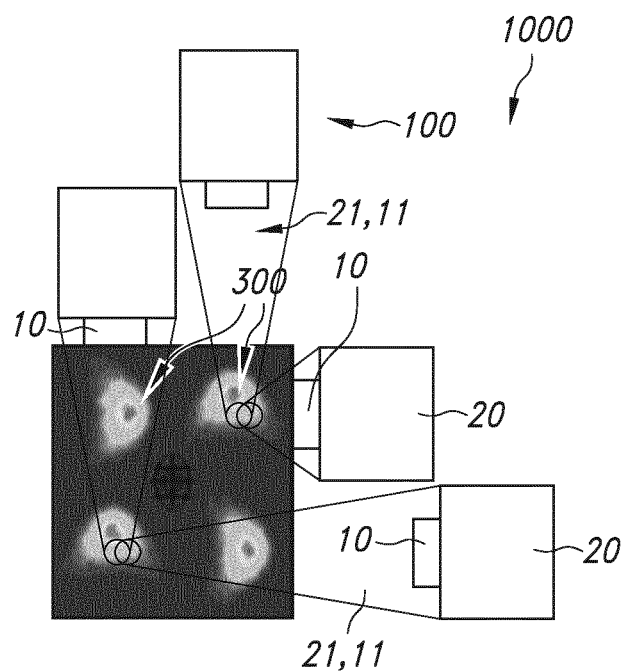

FIG. 2d schematically depicts an embodiment of the light generating device 1000, or part thereof, wherein one or more sets of neighboring laser light sources 10, have no overlapping spots 300 or less overlap of spots 300 than one or more sets of non-neighboring n laser light sources 10.

Figure 3A:
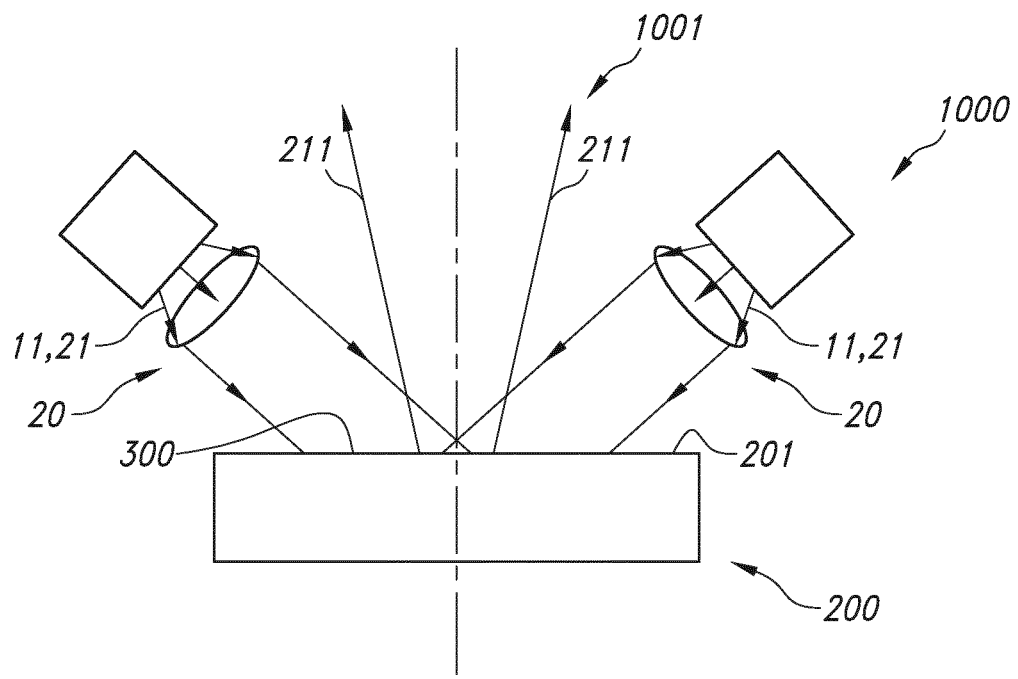
FIGS. 3a-3b schematically depict some further aspects.

FIG. 3a schematically depicts the use of a lens as focusing optics 20.

Figure 3B:
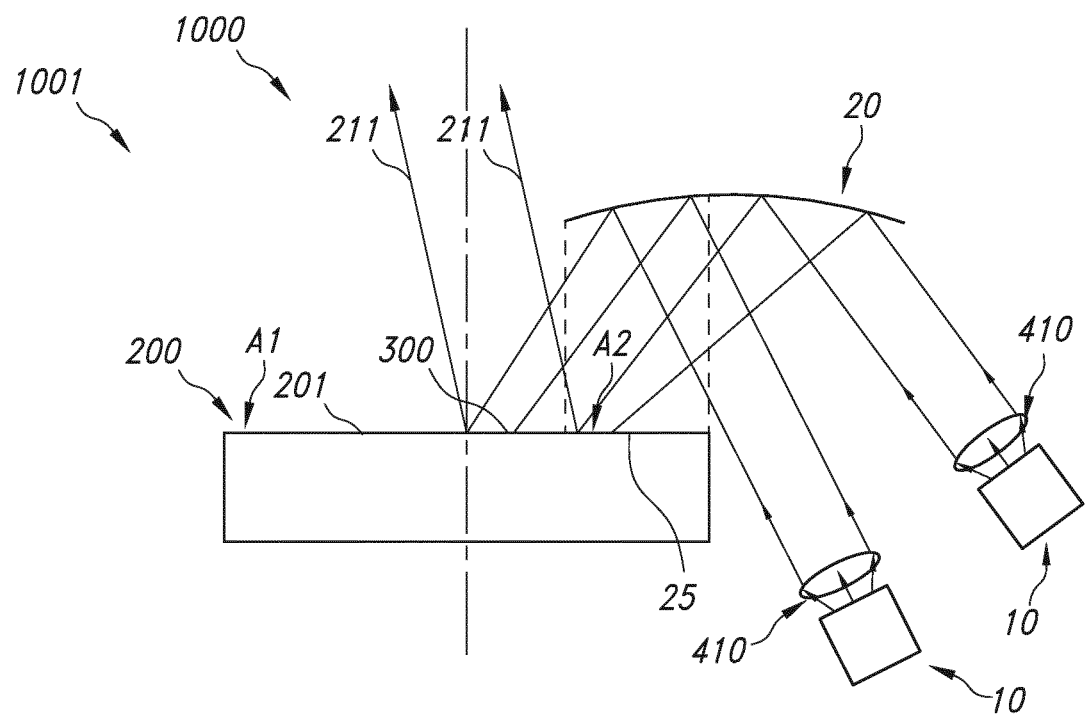

FIG. 3b schematically depicts an embodiment wherein the laser light source light 11 is precollimated. This embodiment is not limited to the embodiment depicted in FIG. 3b, but may apply to other embodiments as well.

Further, FIG. 3b schematically depicts an embodiment wherein one focusing optics 20 is configured downstream of two (or more) (laser) light sources 10. As schematically depicted, here the (laser) light sources are configured at different lateral distances from the first face 201 and also at different height. Note that both are options, which may independently be chosen. this will be apparent for the person skilled in the art.

Further, by way of example, it is shown that the focusing optics is partly configured over the luminescent body 200, more precisely its first face. The first face 201 has a first area A1, wherein parallel to a normal 202 to the first face 201 the focusing optics 20 have projections 25 on the first face 201, wherein the projections 25 have a total area A2, wherein A2/A1≤0.2.

Referring to FIGS. 3b and 2b, the series of at least 4 focusing optics (in FIG. 2b 8 reflective focusing optics) may be configured around the luminescent body 200 but is configured at some distance from the luminescent body, i.e. over the luminescent body, optionally with some lateral displacement relative to the luminescent body. In this way, A2/A1 may be minimized.

Figure 4:
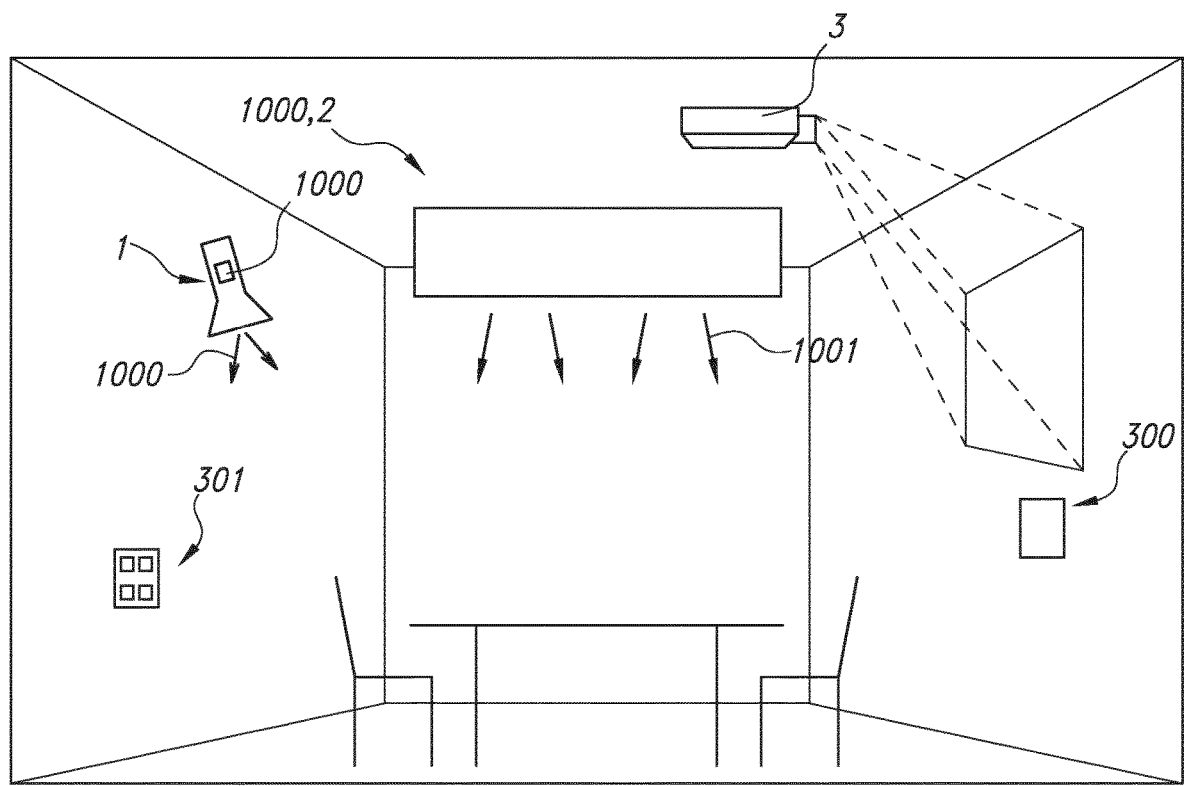
FIG. 4 schematically depicts embodiments of applications.

FIG. 4 schematically depicts an embodiment of a luminaire 2 comprising the light generating device 1000 as described above. Reference 301 indicates a user interface which may be functionally coupled with the control system 300 comprised by or functionally coupled to the lighting system 1000. FIG. 4 also schematically depicts an embodiment of lamp 1 comprising the light generating device 1000. Reference 3 indicates a projector device or projector system, which may be used to project images, such as at a wall.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising"

may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device comprising (i) n laser light sources, (ii) focusing optics, and (iii) a plurality of luminescent bodies, wherein:
the n laser light sources are configured to generate laser light source light; wherein the focusing optics are configured to focus the laser light source light into a focused beam of laser light source light; wherein n≥4;
the luminescent bodies comprising a luminescent material, wherein the luminescent bodies are configured in a light receiving relationship with the n laser light sources, wherein the luminescent material is configured to convert at least part of the laser light source light into luminescent material light;
the n laser light sources, and focusing optics are configured to provide in an operational mode light spots of laser light source light on the plurality of luminescent bodies, wherein k sets of light spots each have an individually selected number of m light spots, wherein two or more of the light spots within each set have a partial overlap, wherein 2≤m≤n and 1≤k<n; and
wherein a first spot area is defined by 10-100% of the maximum intensity in the light spot, wherein for at least one of the light spots within at least one of the k sets applies that in the range of 5-80% of its first spot area overlaps with at least another first spot area within the set,
wherein for each of the luminescent bodies at least two of n laser light sources, together with the focusing optics, are configured to provide in the operational mode light spots of laser light source light on the respective luminescent body.

2. The light generating device according to claim 1, wherein the focusing optics comprise reflective focusing optics.

3. The light generating device according to claim 1, wherein the focusing optics are selected from the group of parabolic mirrors and ellipsoid mirrors.

4. The light generating device according to claim 1, wherein a second spot area is defined by 50-100% of the maximum intensity in the light spot, wherein for at least one of the light spots within at least one of the k sets applies that in the range of 0-60% of its second spot area overlaps with at least another second spot area within the set, and in the range of 10-80% of its first spot area overlaps with the at least another first spot area.

5. The light generating device according to claim 1, wherein for at least one of the light spots applies that its first spot area, does not overlap with at least another first spot area.

6. The light generating device according to claim 1, wherein the laser light sources are configured to generate laser light source light having the same color point; and wherein n≥4.

7. The light generating device according to claim 1, comprising n lighting units, wherein each of the n lighting units comprises (i) the laser light source configured to generate the laser light source light and (ii) focusing optics configured to focus the laser light source light into a focused beam of laser light source light.

8. The light generating device according to claim 1, wherein at least one of the luminescent bodies comprises a ceramic body comprising the luminescent material; wherein the light generating device comprises a thermally conductive element, wherein the luminescent body is configured in thermal contact with the thermally conductive element; and wherein the luminescent material comprises a luminescent material of the type $A_3B_5O_{12}$:Ce, wherein A comprises one or more of Y, La, Gd, Tb and Lu, and wherein B comprises one or more of Al, Ga, In and Sc.

9. The light generating device according to claim 1, wherein the luminescent bodies have a cross-section selected from a circular, triangular, square, rectangular, pentagonal, hexagonal, octagonal or decagonal shape.

10. The light generating device according to claim 1, wherein at least one of the luminescent bodies comprises a first face, wherein the n laser light sources together with the focusing optics, are configured to provide in the operational mode the light spots of laser light source light on the first face; wherein $n \geq 4$; wherein the n laser light sources, are configured around the first face; wherein the first face has a first area A1, wherein parallel to a normal to the first face the focusing optics have projections on the first face, wherein the projections have a total area A2, wherein $A2/A1 \leq 0.2$.

11. The light generating device according to claim 1, wherein at least one of the luminescent bodies comprises a first face, wherein the n laser light sources are configured at a lateral distance from the first face, wherein two or more sets of laser light sources have different lateral distances.

12. The light generating device according to claim 1, wherein $n \geq 4$, wherein one or more sets of neighboring laser light sources, have no overlapping spots or less overlap of spots than one or more sets of non-neighboring n laser light sources.

13. The light generating device according to claim 1, wherein light generating device is configured to generate device light comprising luminescent material light and unconverted laser light source light.

14. The light generating device according to claim 1, further comprising a control system configured to control the laser light sources.

15. A lamp or a luminaire or a projector device comprising the light generating device according to claim 1.

* * * * *